United States Patent
Flynn et al.

(10) Patent No.: US 11,705,924 B2
(45) Date of Patent: *Jul. 18, 2023

(54) LOW-LATENCY ENCODING USING A BYPASS SUB-STREAM AND AN ENTROPY ENCODED SUB-STREAM

(71) Applicant: Apple Inc., Cupertino, CA (US)

(72) Inventors: David Flynn, Muchen (DE); Alexandros Tourapis, Los Gatos, CA (US); Khaled Mammou, Danville, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/814,487

(22) Filed: Jul. 22, 2022

(65) Prior Publication Data

US 2022/0360280 A1 Nov. 10, 2022

Related U.S. Application Data

(63) Continuation of application No. 17/061,411, filed on Oct. 1, 2020, now Pat. No. 11,398,833.

(Continued)

(51) Int. Cl.
*H03M 7/30* (2006.01)
*H03M 7/40* (2006.01)

(52) U.S. Cl.
CPC ................. *H03M 7/4006* (2013.01)

(58) Field of Classification Search
CPC .......... H03M 7/4006; H03M 7/6017; H03M 7/6011; H03M 7/40; H03M 7/30; H04N 19/91

(Continued)

(56) References Cited

U.S. PATENT DOCUMENTS 7,885,988 B2 * 2/2011 Bashyam ................ H03M 7/30
                                                          707/972
7,970,216 B2 * 6/2011 Bashyam ............... H04N 19/17
                                                          382/233

(Continued)

FOREIGN PATENT DOCUMENTS

WO        2020187709        9/2020

OTHER PUBLICATIONS

International Search Report and Written Opinion from PCT/US2020/054142, dated Feb. 3, 2021, pp. 1-19.

(Continued)

*Primary Examiner* — Jean B Jeanglaude
(74) *Attorney, Agent, or Firm* — Alexander A. Knapp; Kowert, Hood, Munyon, Rankin & Goetzel, P.C.

(57) ABSTRACT

A system comprises an encoder configured to entropy encode a bitstream comprising both compressible and non-compressible symbols. The encoder parses the bitstream into a compressible symbol sub-stream and a non-compressible sub-stream. The non-compressible symbol sub-stream bypass an entropy encoding component of the encoder while the compressible symbol sub-stream is entropy encoded. When a quantity of bytes of entropy encoded symbols and bypass symbols is accumulated a chunk of fixed or known size is formed using the accumulated entropy encoded symbol bytes and the bypass bytes without waiting on the full bitstream to be processed by the encoder. In a complementary manner, a decoder reconstructs the bitstream from the packets or chunks.

20 Claims, 8 Drawing Sheets

Related U.S. Application Data

(60) Provisional application No. 62/909,691, filed on Oct. 2, 2019.

(58) Field of Classification Search
USPC .......................................................... 341/87
See application file for complete search history.

(56) References Cited

U.S. PATENT DOCUMENTS

| | | | |
|---|---|---|---|
| 8,520,740 | B2 | 8/2013 | Flachs et al. |
| 8,643,515 | B2 | 2/2014 | Cideciyan |
| 9,191,670 | B2 | 11/2015 | Karczewicz et al. |
| 9,223,765 | B1 | 12/2015 | Alakuijala et al. |
| 9,729,169 | B2 | 8/2017 | Kalevo et al. |
| 10,277,248 | B2 | 4/2019 | Lee |
| 10,587,286 | B1 | 3/2020 | Flynn et al. |
| 10,715,618 | B2 | 7/2020 | Bhaskar |
| 11,044,495 | B1 | 6/2021 | Dupont et al. |
| 11,398,833 | B2 | 7/2022 | Flynn et al. |
| 2008/0050025 | A1* | 2/2008 | Bashyam ............ H04N 19/172 382/233 |
| 2008/0050047 | A1 | 2/2008 | Bashyam et al. |
| 2008/0154928 | A1 | 6/2008 | Bashyam et al. |
| 2012/0300839 | A1 | 11/2012 | Sze et al. |
| 2013/0106627 | A1 | 5/2013 | Cideciyan |
| 2013/0182757 | A1* | 7/2013 | Karczewicz ........... H04N 19/60 375/240.18 |
| 2014/0334557 | A1 | 11/2014 | Schierl et al. |
| 2016/0286215 | A1 | 9/2016 | Gamei et al. |
| 2017/0063392 | A1 | 3/2017 | Kalevo et al. |
| 2017/0118675 | A1 | 4/2017 | Boch |
| 2017/0155402 | A1 | 6/2017 | Karkkainen et al. |

OTHER PUBLICATIONS

Flynn D et al, "G-PCC Bypass coding of bypass bins", dated Mar. 21, 2019, pp. 1-3.
Sharman K et al, "CABAC Packet-Based Stream", dated Nov. 18, 2011, pp. 1-6.
Lasserre S et al, "On bypassed bit coding and chunks", dated Apr. 6, 2020, pp. 1-3.
David Flynn et al, "G-pcc low latency bypass bin coding", dated Oct. 3, 2019, pp. 1-4.

* cited by examiner

LOW-LATENCY ENCODING USING A BYPASS SUB-STREAM AND AN ENTROPY ENCODED SUB-STREAM

PRIORITY CLAIM

This application is a continuation of U.S. patent application Ser. No. 17/061,411, filed Oct. 1, 2020, which claims benefit of priority to U.S. Provisional Application Ser. No. 62/909,691, filed Oct. 2, 2019, which are incorporated herein by reference in their entirety.

TECHNICAL FIELD

This disclosure relates generally to compression and decompression of bit-streams using an entropy-based encoder.

DESCRIPTION OF THE RELATED ART

Various devices, including but not limited to personal computer systems, desktop computer systems, laptop and notebook computers, tablet or pad devices, digital cameras, digital video recorders, and mobile phones or smart phones, may include software and/or hardware that implement an encoding or decoding process using entropy encoding techniques, such as arithmetic encoding, Huffman coding, etc. For example, a device may include an apparatus (e.g., an integrated circuit (IC), such as a system-on-a-chip (SOC), or a subsystem of an IC), that may receive and process digital input from one or more sources and outputs the processed information, e.g. pictures/frames or regions of a picture/frame, or other information according to one or more processing methods involving entropy-based encoding. As another example, a software program may be implemented on a device that may receive and process digital input from one or more sources and output the processed information according to one or more processing methods that involve entropy-based encoding.

SUMMARY OF EMBODIMENTS

In some embodiments, a system for encoding a bitstream comprises a computing device configured to separate a stream of symbols to be encoded into: (a) a compressible symbol sub-stream and (b) an non-compressible symbol sub-stream. To encode the bitstream, the computing device is also configured to entropy encode the symbols of the compressible symbol sub-stream and allow the in-compressible symbol sub-stream to bypass an encoder that entropy encodes the compressible symbol sub-stream. Additionally, the computing device is configured to form a chunk comprising entropy encoded symbols from the compressible symbol sub-stream and non-compressible symbols from the non-compressible symbol bypass sub-stream, and provide the chunk for transmission or storage, in response to accumulating a quantity of entropy encoded symbols and non-compressible symbols meeting a payload size of a payload of the chunk. In some embodiments, the chunk may be formed into a packet for transmission over a network. Also in some embodiments, the system may further comprise a bypass buffer and an entropy encoded symbol buffer, wherein bypass bytes and entropy encoded symbol bytes are written to the respective buffers and concatenated to form a chunk or packet in response to a quantity of bytes being accumulated meeting a payload size of the chunk or packet. In other embodiments, the bypass bytes and the entropy encoded symbol bytes may be written directly into a chunk or packet, wherein one sub-stream is written in a forward order from one end of the chunk or packet while the other sub-stream is written in a reverse order from another end of the chunk or packet.

In some embodiments, a system for decoding a bitstream comprises a computing device configured to receive a packet comprising a payload comprising an entropy encoded symbols portion and a non-entropy encoded symbols portion. The packet also includes a header indicating a length of the payload that is filled with entropy encoded symbols or a length of the payload that is filled with non-entropy encoded symbols. To decode the packet, the computing device is configured to determine based on the header, a starting point in the payload for the entropy encoded symbols and a starting point in the payload for the non-entropy encoded symbols, read the entropy encoded symbols from the determined starting point for the entropy encoded symbols and decode the read entropy encoded symbols, read the non-entropy encoded symbols from the determined starting point for the non-entropy encoded symbols, and combine the decoded entropy encoded symbols and the non-entropy encoded symbols into a decoded stream of symbols.

Figure 1A:
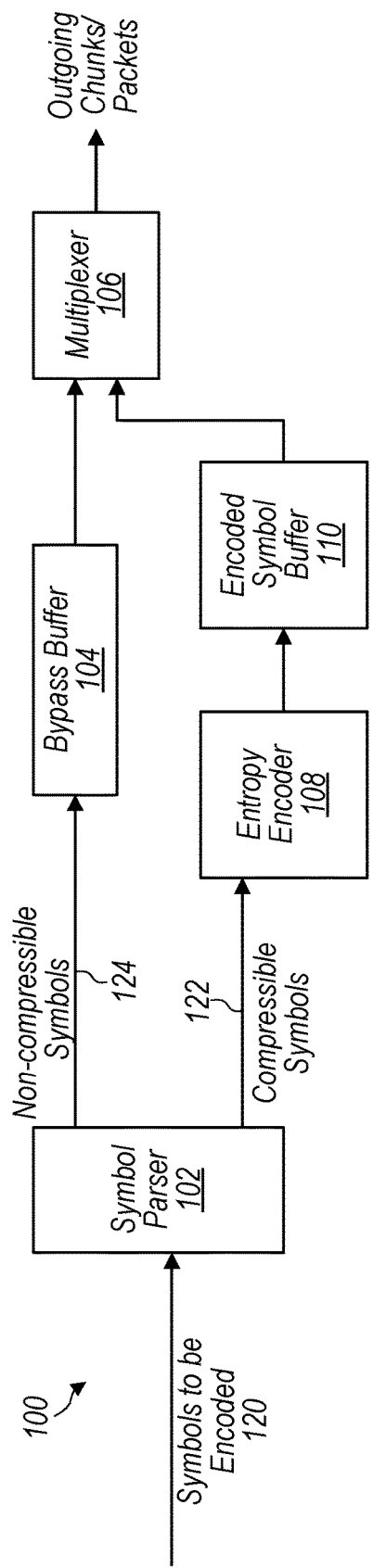
FIG. 1A illustrates an example encoding loop of an encoder, according to some embodiments.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Comprising." This term is open-ended. As used in the appended claims, this term does not foreclose additional structure or steps. Consider a claim that recites: "An apparatus comprising one or more processor units . . . ." Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112(f), for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values. The terms "first" and "second" do not necessarily imply that the first value must be written before the second value.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

DETAILED DESCRIPTION

Entropy encoding, such as arithmetic encoding, Huffman encoding, etc., may be a bottleneck for processing image, video, point cloud, and/or other types of data. For example decoding entropy encoded data may be a bottleneck for an application utilizing image, video, or point cloud data. Also, entropy encoding and decoding may be a highly serialable and computationally expensive process.

In some embodiments, an entropy encoder may parse an incoming symbols bitstream to be compressed/encoded into a compressible symbol sub-stream and an non-compressible symbol sub-stream. Because arithmetic encoding takes advantage of probabilities of occurrence of symbols in order to compress the symbols, some symbols that have even probabilities of occurring or not occurring in a bitstream may not benefit, in terms of compression efficiency, from being entropy encoded. However, such non-compressible symbols may nevertheless require computational resources and time to be processed by an entropy encoding component of an encoder. Thus, compression efficiency and processing time can be reduced by excluding non-compressible symbols from a sub-stream of symbols to be entropy encoded by an entropy encoding component of an encoder, and instead directing the non-compressible symbols into a bypass sub-stream.

In some embodiments, further improvements in latency may be achieved by forming chunks or packets from encoded symbols of a compressible symbol bitstream that have been encoded by an entropy encoding component and from non-compressible symbols of a bypass bitstream. For example, instead of waiting for a full bitstream to be processed, a portion of the bitstream that has already been processed may be formed into chunks or packets, thus reducing an encoding and decoding latency. The decoding latency may be reduced because a decoder does not need to buffer a full bitstream prior to decoding the entropy encoded compressible symbols and combining the decoded compressible symbols with non-compressible symbols to reconstruct the original bitstream.

In some embodiments, the packets or chunks may have a fixed size or may have a known size that is signaled to a decoder. For example, in some embodiments, the packets or chunks may have a fixed size of 256 bytes.

In some embodiments, a packet or chunk may include a header. The header may indicate a length of a payload portion of the packet or chunk that is filled with entropy encoded symbol bytes or may indicate a portion of the packet or chunk that is filled with bypass bytes. Because the packet has a fixed or known payload size, a decoder may subtract the indicated portion length from the fixed or known payload size to determine a length of the other one of the portions. Furthermore, the decoder may utilize this information to determine a dividing point or break point between the portions. Thus, the decoder may be able to determine a starting point in the payload for both portions (e.g. the entropy encoded compressible symbol portion and the non-compressible symbol bypass portion). Because the decoder knows where both portions begin, the decoder may simultaneously read from both portions without having to first buffer one of the two portions. For example, an alternative strategy is to encode one portion in a forward order and another portion in a reverse order. However, in such embodiments, the decoder may be required to buffer the full length of the reverse ordered portion to reach a starting point to read from. However, in such embodiments, it may not be necessary to signal the respective sizes of the portions in the header for the chunk or packet.

In some embodiments, the chunk or packet size (S_p) controls the overall system latency. In some embodiments, the chunk or packet size (S_p) may be fixed or may be adaptively chosen. Also, the chunk or packet size (S_p) may be implicitly defined or explicitly signaled in a bitstream header.

In some embodiments, in which a 256 byte packet or chunk size is used, a payload size may be 255 bytes and a header size may be 1 byte. The header information may not be entropy encoded, even though a portion of the payload of the packet or chunk is entropy encoded. In some embodiments, an encoding order (either forward or reverse) for the two portions (e.g. entropy encoded symbol portion and bypass non-compressible symbol portion) may be fixed or adaptively switched based on an implicit rule or explicitly signaled in the bitstream.

In some embodiments, the header may be placed either at the start or the end of a packet or chunk. This may be possible because the packet or chunk is of a known size, such that the decoder can locate the header as being the last byte of the known size packet or chunk.

In some embodiments, the behavior of an encoder in constructing a sequence of packets or chunks has a significant effect on a decoder's resources requirements and the end-to-end system latency. In particular, there is a latency between encoding a symbol with an entropy encoder and the representation of that symbol appearing in its bit-wise output as part of its internal renormalization process. Similarly, there is a latency between the production of a bit (either entropy encoded or bypass) and the assembly of eight bits to form a byte. Furthermore, there may be data dependencies between symbols coded by the entropy encoder and bypass bits (e.g. bits corresponding to non-compressible symbols included in a bypass sub-stream).

FIG. 1A illustrates an example encoding loop of an encoder, according to some embodiments.

Figure 1B:
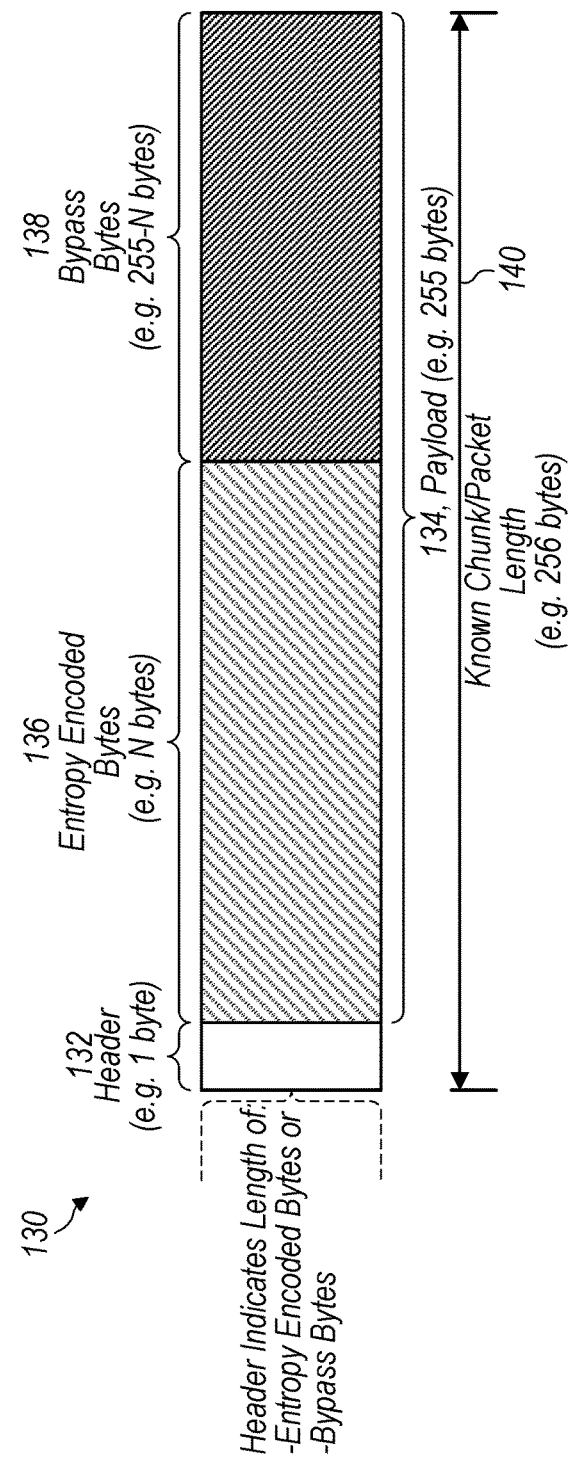
FIG. 1B illustrates an example chunk or packet encoded by the encoder, according to some embodiments.

In some embodiments, an encoding process may include separating a bitstream into compressible symbols and non-compressible symbols. The compressible symbols may be provided to an entropy encoder (such as an arithmetic encoder) that outputs bytes to an entropy encoded symbol buffer. For example encoder 100 receives symbols to be encoded 120, and the symbols are parsed by symbol parser 102 into a first sub-stream 122 comprising compressible symbols and a second sub-stream 124 comprising non-compressible symbols. The compressible sub-stream 122 is entropy encoded via entropy encoder 108 and output to encoded symbol buffer 110. Also the bypass sub-stream 124 is added to bypass buffer 104. When enough bytes have been accumulated in either encoded symbol buffer 110 or bypass buffer 104 to sum together to form a packet or chunk, multiplexer 106 combines the encoded symbols and the non-compressible symbols from the respective buffers into a chunk or packet of fixed or known length, (e.g. 256 bytes). While not shown, the encoder 100 may further include a component that includes a header in the formed packet or chunk and that indicates in the header a size of at least one of the portions included in the packet or chunk (e.g. a length of the entropy encoded symbol portion or a length of the non-compressible symbol portion). For example, an example packet is shown in FIG. 1B.

In some embodiments, the bytes output to the encoded symbol buffer 110 may be labeled (S_ac) and the bytes output to the bypass buffer 104 may be labeled (S_bp) When the sum of the size in bytes for both buffers, e.g. S_ac+S_bp, equals a packet size S_p (e.g., S_p=255), a new packet may be created by concatenating the bytes stored in encoded symbol buffer 110 and bypass buffer 104. A header of a fixed size may also be added at the beginning of the packet to specify the number of entropy encoded bytes (e.g. arithmetically encoded bytes) S_ac. The generated packet could be directly streamed to the decoder side, without any extra encoding delay FIG. 1B illustrates an example chunk or packet encoded by the encoder, according to some embodiments.

Packet 130 includes a header 132 and a payload 134. The payload includes an entropy encoded symbol portion 136 and a bypass non-compressible symbol portion 138. The header indicates either a length of an entropy encoded portion 136 of payload 134 of the packet 130 or a length of bypass non-compressible symbol portion 138 of the payload 134 of packet 130. In some embodiments, the packet may have a fixed or known overall length 140, which may be 256 bytes, and the header 132 may have a known length, such as one byte.

Figure 1C:
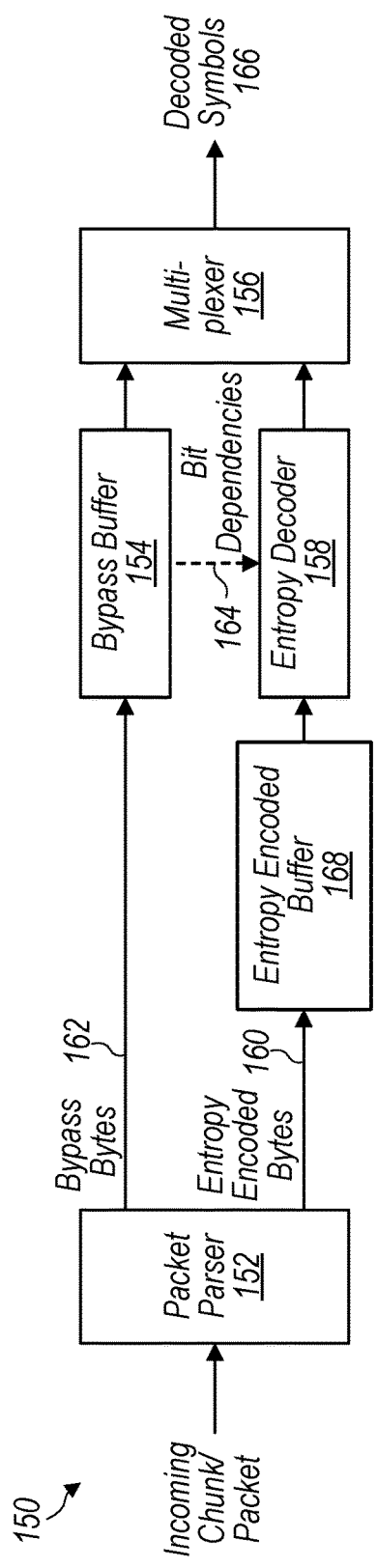
FIG. 1C illustrates an example decoding loop of a decoder, according to some embodiments.

FIG. 1C illustrates an example decoding loop of a decoder, according to some embodiments.

In some embodiments, a decoder, such as decoder 150 decodes packets or chunks in an order in which they are received as soon as they are received. The packet parser 152 of decoder 150 may read the fixed size header of an incoming packet or chunk to determine respective sizes of the portions of the payload of the packet or chunk, such as S_ac and S_bp, wherein one can be subtracted from the known or fixed packet length of the payload of the packet to determine the other. For example, S_bp may be equal to S_p-S_ac.

In some embodiments, the packet parser 152 may output an entropy encoded byte stream 160 to entropy decoder 158 via entropy encoded buffer 168 and may output a bypass byte stream 162 to bypass buffer 154. In some embodiments, entropy encoded bytes being decoded by entropy encoder 158 may have decoding dependencies on bits included in bypass bytes in bypass buffer 154. For example FIG. 1C shows dependencies 164. In some embodiments, entropy encoded buffer 168 may buffer an entropy encoded byte stream 160 while waiting for a bypass byte that includes a bit upon which an entropy encoded byte depends.

The entropy decoded symbols from entropy decoder 158 may be combined with bypass bytes from bypass buffer 154, at multiplexer 156, to form a reconstructed stream of decoded symbols 166.

Figure 1D:
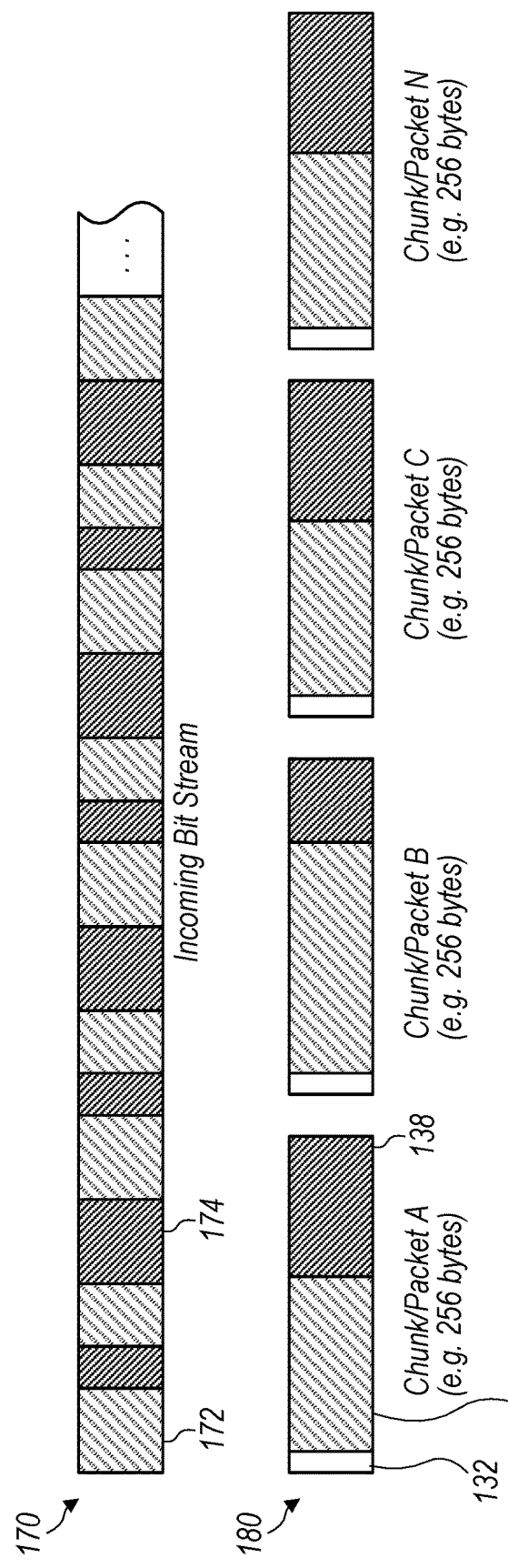
FIG. 1D illustrates an example bitstream comprising compressible and non-compressible symbols prior to being encoded and a set of chunks or packets resulting from encoding the bitstream, according to some embodiments.

FIG. 1D illustrates an example bitstream comprising compressible and non-compressible symbols prior to being encoded and a set of chunks or packets resulting from encoding of the bitstream, according to some embodiments.

In some embodiments, an incoming bitstream, such as bitstream 120, may include both compressible and non-compressible symbols as shown in bitstream 170. For example bitstream 170 includes compressible symbols 172 and non-compressible symbols 174. An encoder, such as encoder 100, may output a sequence of packets to represent bitstream 170. For example an encoder may output sequence of packets 180, wherein each packet includes a header 132, entropy encoded compressible symbols 136 and bypass non-compressible symbols 138.

Figure 2:
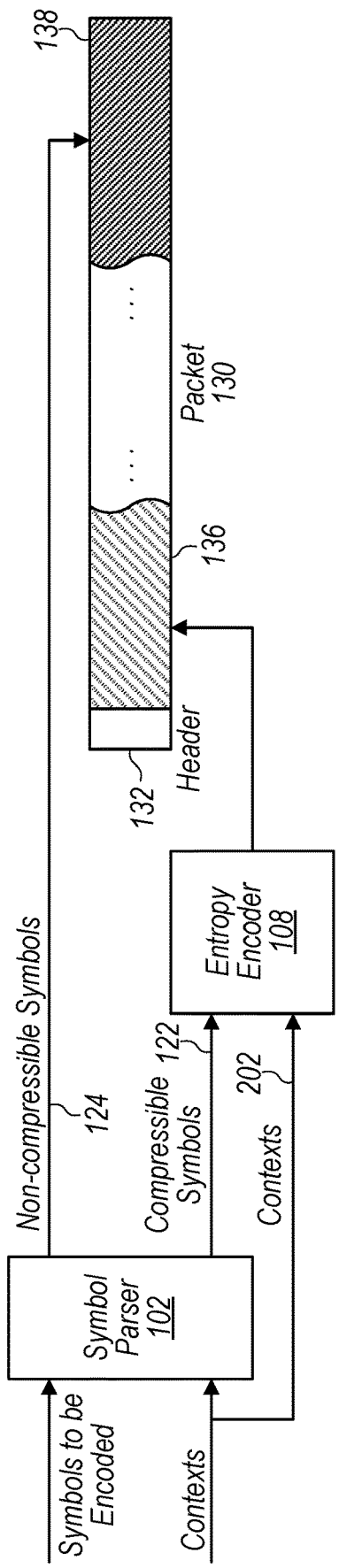
FIG. 2 illustrates an example encoding loop of an encoder that writes directly to a packet or chunk, according to some embodiments.

FIG. 2 illustrates an example encoding loop of an encoder that writes directly to a packet or chunk, according to some embodiments.

In some embodiments, encoded symbols from a compressible symbol sub-stream 122 that have been entropy encoded by entropy encoder 108 may be written directly to a packet, such as packet 130. For example, the entropy encoded symbols may be written in a forward order in entropy encoded bytes 136. Also, bypass symbols from non-compressible symbol sub-stream 124 may be written directly to packet 130 in a reverse order in bypass bytes 138.

In some embodiments, symbol parser 102 may further parse or receive contexts 202 and provide the contexts to entropy encoder 108 for use in encoding compressible symbols of compressible symbol sub-stream 122.

Figure 3:
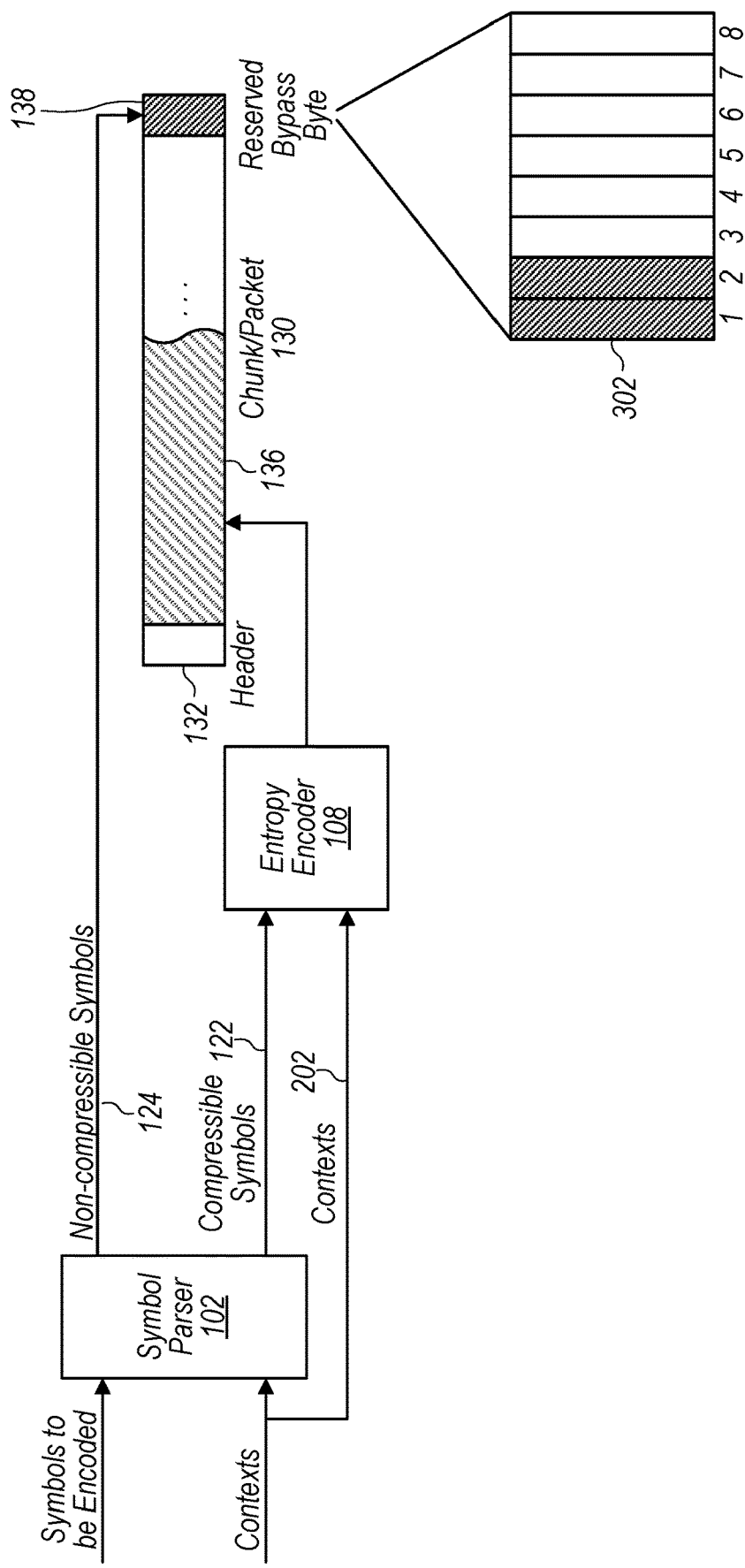
FIG. 3 illustrates example encoding loop of an encoder that writes bypass bits to a reserved bypass byte, according to some embodiments.

FIG. 3 illustrates example encoding loop of an encoder that writes bypass bits to a reserved bypass byte, according to some embodiments.

In some scenarios, a decoder, such as decoder 150 may be required to buffer an entropy encoded stream 160 or a bypass stream 162 to resolve dependencies. Alternatively, the decoder may buffer packets until required packets are received to resolve the dependencies. However, in certain circumstances, this may increase a decoding latency for the decoder. For example, imagine the extreme case of the symbol sequence $\{x\_0, x\_1, \ldots\}$, where $x\_0$ is a bypass bit and $x\_1$ is an arithmetically coded bit with a decoding dependency on $x\_0$ (for instance, the context of $x\_1$ is determined by the value of x_0). If there are no more bypass bits in a packet being formed, a bypass byte will not be written in the first packet. This is because the bypass buffer 104 may need to accumulate 8 bypass bits to make a bypass byte that can be written to the packet. Indeed, the first bypass byte may not be written until seven more bypass bits are produced. This latency is theoretically unbounded, meaning that a decoder may have to buffer a significant number of packets (or worse, all packets) before decoding can resume.

In some embodiments, such concerns are addressed by reserving at least one bypass byte in a packet being formed. In one embodiment, the decoding latency/resources are bounded by reserving bytes in a current packet and back-propagating "future" bypass bits.

For example, each time a bypass symbol is sent to the encoder, the following process may be performed:
  if the byte-wise bypass bit accumulator of the encoder is empty, reserve one byte in the current packet for use as a bypass byte (e.g. increment S_bp). Record the location of the reserved bypass byte as P_bp.
  append the bit to the accumulator byte
  if the accumulator byte is full, write the completed byte to the reserved location P_bp The packet may only be transmitted when it is both fully allocated (S_bp+S_ac==S_p) and any reserved bypass bytes are complete. (Further entropy encoded bytes are written to subsequent packets). Note that P_bp may be a pointer to a buffer location. Further note that the storage for the bypass bin accumulator may occupy the reserved byte.

For example, FIG. 3 illustrates a packet 130 with a reserved bypass byte 138 that includes 8 bits 302. Two of the bits have been written with non-compressible symbols and the other 6 bits are yet to be filled.

While the above bounds the decoding resources, the burden is instead placed on the encoder (albeit a slightly lesser burden than the decoder equivalent). An alternative embodiment that allows both encoder and decoder resources and system latency to be constrained is as follows. Each packet that contains at least one bypass byte (e.g. S_bp>0) is constructed with an additional header that indicates the number of valid bits in the final byte of the bypass sub-buffer. This header may, for example, comprise the first three bits of the first bypass byte of each packet, or alternatively, the last three bits of the last byte. Such a mechanism allows the encoder to flush the packet without waiting for any reserved byte to be complete, instead the partial byte is used.

An encoder may, more generally, chose an arbitrary assembly of entropy encoded bytes and bypass bytes to form a packet according to particular design constraints. In order to ensure that a decoder has the resources to decode such a stream, the maximum number of buffers a decoder may be required to buffer may be signaled in a parameter set.

Figure 4:
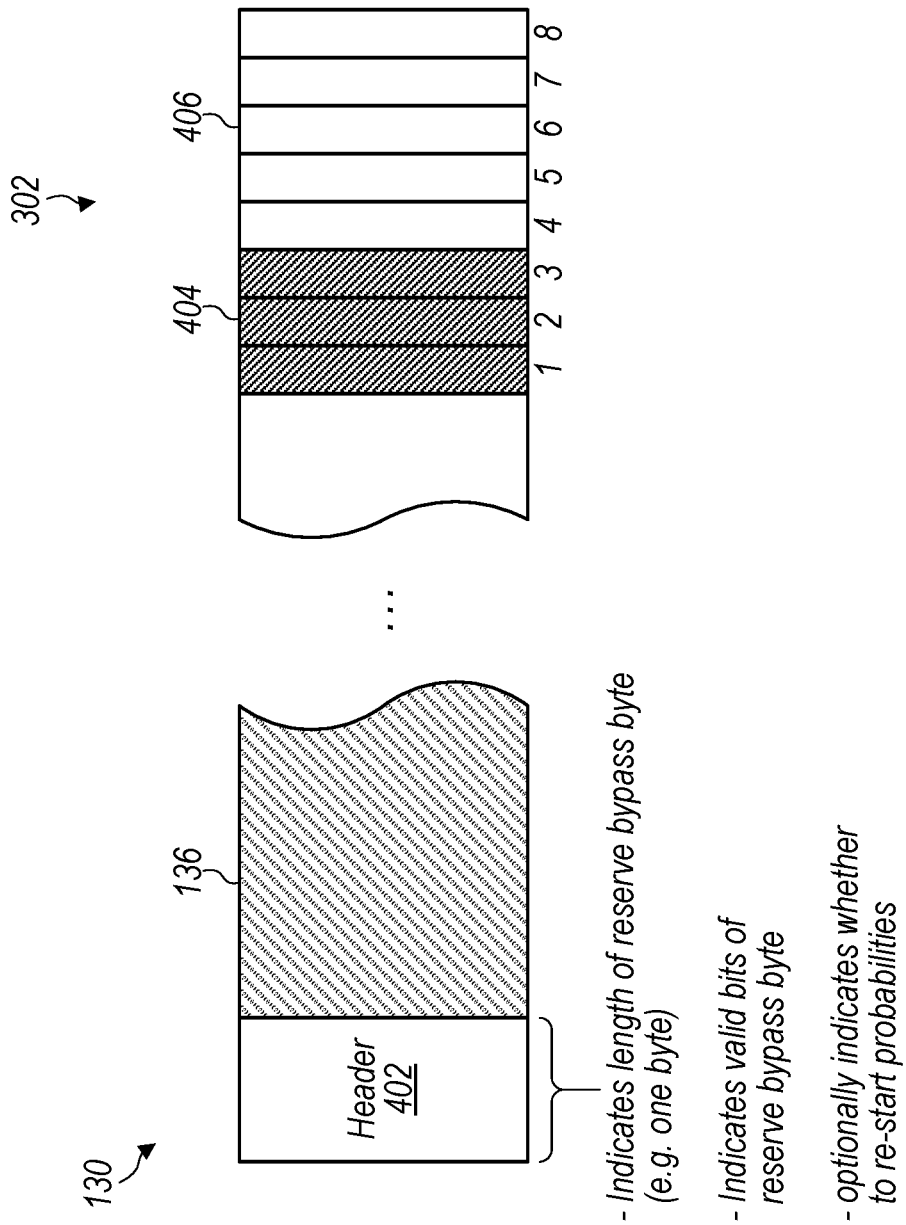
FIG. 4 illustrates an example packet or chunk comprising a reserved bypass byte, according to some embodiments.

FIG. 4 illustrates an example packet or chunk comprising a reserved bypass byte, according to some embodiments.

For example, 402 of packet 130 may indicate that bits 1, 2, and 3 of reserved bypass byte 302 are valid. In such as scheme, the encoder may not have to buffer packet 130 until all 8 bits of reserve bypass byte 302 are filled, but instead may provide packet 130 to transmission or storage prior to the reserve bypass byte being filed and instead indicated in the header 402 which bits of reserve bypass byte 302 are valid bits. For example bits 404 may be valid and bits 406 may be empty or padded bits that are not valid.

In some embodiments, further enhancements may include signaling both S_ac and S_bp for a last packet of a packet sequence. For example, the last packet may have a number of useful bytes lower than S_p.

In some embodiments, the encoder may pad the last packet with extra bytes so it has a size of S_p. The padded bytes may be dropped on the decoder side. The information needed to know when to stop decoding without using the padded bytes could be implicitly derived or explicitly signaled in the bitstream or in another layer. Another alternative, would consists in padding the packet with zeros or ones.

In some embodiments, the encoder may explicitly write in the header the size of the packet (for packets smaller than normal). Such information may also be handled by the file format/network transport layer.

In some embodiments, the encoder may explicitly write in the header the size S_bp. Note that if two headers are supported, then it is possible to place the headers together (at the beginning), but also place the second header (for S_bp), at position (header_size_ap+1+S_ap), if of course this position is <S_p. Note also if there is only one byte left, you can just enter 0 in it (empty bypass).

The method chosen to handle the last packet could be implicitly specified or explicitly signaled in a high level syntax header/parameter set.

In some embodiments, signaling both S_ac and S_bp makes it possible to signal data without having to wait for the full packet to be filled up (e.g., send the available data with a predefined latency). While this approach may waste some bytes, for some low-delay applications that may be needed. Also, signaling both S_ac and S_bp makes it possible to send a packet that corresponds to a particular frame without having to interleave the frame with the next frame. Whether a single size or both sizes are signaled could be specified in a high level syntax header/parameter set.

Alternative constructions are possible that do not require S_ac and S_bp to both be signaled. For example, one embodiment assumes a transmission system that can identify the length of the entire data unit which contains the packets. In such a case, it can clearly be identified that the last packet exceeds the data unit length, and the value S_p is clipped such that the packet fits within the data unit. Such a process works with either the dual-forward sub-buffer construction or the forward plus reversed sub-buffer method. In another embodiment, the embodiment relies on the self-termination properties of the unpacking process, but requires both sub-streams to be written in the forward direction. In this construction, the termination of the parsing process results in all the valid data being consumed. The construction permits additional data to follow the truncated packet that does not use the methods outlined in this disclosure.

As mentioned above, in some situations there may be dependencies between packets, wherein some symbols included in a bypass stream are needed to decode entropy encoded symbols. To address these dependencies some of the following techniques may be used:
  The packet header may signal whether the probabilities for the contexts are "restarted" (i.e., reset to the default values), or not. Allowing the probabilities to be restarted makes it possible to independently decode the associated packets, referred to as independent packets (in contrast with the dependent packets).
  For independent packets, the encoder may make sure that a symbol is not encoded over two packets.
  This previous requirement could also be extended to dependent packets for error resilience reasons.
  The header information specifying whether the probabilities should be reset or not, could be extended to explicitly specify the initial probabilities values. For example, instead of using the default probability state (i.e., uniform probability for all the symbols), we could define a number of presets biased toward different symbol statistics.

This feature could be turned on and off by a higher level syntax structure (e.g., sequence parameter set, slice/tile/block headers).

In some embodiments, a dependent/independent packets mechanism may make it possible to implement a wavefront process. In this case, another header information specifying the independent packets positions could be introduced.

In some embodiments, the packet ordering information cloud be handed in at least the following manners:

Explicitly specifying in the bitstream the packet order as a header information. For instance, a certain number N of bytes (e.g., 1 byte) could be used to indicate the order, which specifies the packet index modulo a number 2^N. This may be similar to how the Picture Order Count is done for video codecs, which splits the information into a LSB element that is signaled and an MSB component that is implicitly derived.

Getting the information from another system level (e.g., the network layer in the case of TCP packets).

The order is implicitly derived from the order in which the packets are received.

In some embodiments, the packet ordering information could be combined with the probability reset information described in the previous section in order to achieve a more compact header. For example, use 1-2 bits for the probability information and the rest (e.g., 7-6 bits) for the ordering information.

In some embodiments, an example bitstream syntax may be as follows:

| Bitstream syntax |
| --- |
| ae_chunk( ) { <br>   chunk_num_ae_bytes = u(8); <br>   for (i = 0; i < num_ae_bytes; i++) <br>     chunk_ae_byte[i] = u(8); <br>   for (j = 0; i < 255;j++, i++) { <br>     if (chunk_padding_enabled_flag && i == 254) { <br>       chunk_bypass_5bits = u(5); <br>       chunk_bypass_num_flushed_bits = u(3); <br>     } else <br>       chunk_bypass_byte[j] = u(8); <br>   } <br> } | chunk_padding_enabled_flag equal to 1 indicates that the last byte of a chunk containing fewer than 254 chunk_ae_byte elements contains a variable number of padding bits. chunk_flush_enabled_flag equal to 0 indicates that chunk_bypass_5 bits and chunk_bypass_pad are not present in the bitstream.

chunk_num_ae_bytes indicates the number of chunk_ae_byte and chunk_bypass_byte elements present in a chunk.

The variable NumChunkBypassBytes is derived as follows:

Max(0,(chunk_padding_enabled_flag?253:254)−chunk_num_ae_bytes)

chunk_ae_byte[i] specifies the i-th byte of the arithmetically encoded symbol sub-stream of the current chunk. Each chunk_ae_byte[i] is appended to the AeByteStream array as follows:

for (i=0; i<chunk_num_ae_bytes; i++)

AeByteStream[AeStreamLen++]=chunk_ae_byte[*i*]

chunk_bypass_byte[j] specifies the j-th byte of the bypass symbol sub-stream of the current chunk. Each chunk_bypass_byte is appended to the BypassBitStream array as follows:

for (j=0; j<NumChunkBypassBytes; j++)
for (b=7; b>=0; b−−)
BypassBitStream[BypassBitStreamLen++]=(chunk_bypass_byte[j]>>>b) & 1 chunk_bypass_5 bits specifies the values of up to five bypass bits at the end of the bypass symbol sub-stream of the current chunk. Each bit is appended to the BypassBitStream array as follows:

for (b=4; b>=0; b−−)
BypassBitStream[BypassBitStreamLen++]=(chunk_bypass_5 bits>>b) & 1 chunk_bypass_num_flushed_bits specifies the number of bypass bits to be discarded from the end of the BypassBitStream:

BypassBitstream−=Len chunk_bypass_num_flushed_bits

In some embodiments with a reverse ordered bypass bytes, an example bitstream syntax may be as follows:

| Bitstream syntax |
| --- |
| ae_chunk( ) { <br>   chunk_num_ae_bytes = u(8); <br>   for (i = 0; i < num_ae_bytes; i++) <br>     chunk_ae_byte[i] = u(8); <br>   if (i < 255) { <br>     chunk_bypass_5bits = u(5); <br>     chunk_bypass_num_flushed_bits = u(3); <br>   } <br>   for (j = 0; i < 255; j++, i++) { <br>     chunk_bypass_byte[j] = u(8); <br>   } <br> } | chunk_num_ae_bytes is the number of chunk_ae_byte elements present in a chunk. The value of chunk_num_ae_bytes indicates the number of chunk_bypass_byte elements present in a chunk.

The variable NumChunkBypassBytes is derived as follows:

NumChunkBypassBytes=Max(0,256−2−chunk_num_ae_bytes)

chunk_ae_byte[i] specifies the i-th byte of the arithmetically encoded symbol sub-stream of the current chunk. Each chunk_ae_byte[i] is appended to the AeByteStream array as follows:

for (i=0; i<chunk_num_ae_bytes; i++)

AeByteStream[AeStreamLen++]=chunk_ae_byte[*i*]

chunk_bypass_byte[j] specifies the j-th byte of the bypass symbol sub-stream of the current chunk. Each chunk_bypass_byte is appended to the BypassBitStream array as follows:

for (j=NumChunkBypassBytes−1; j>=0; j−−)
for (b=7; b>=0; b−−)
BypassBitStream[BypassBitStreamLen++]=(chunk_bypass_byte[j]>>>b) & 1 chunk_bypass_5 bits specifies the values of up to five bypass bits at the end of the bypass symbol sub-stream of the current chunk. Each bit is appended to the BypassBitStream array (after appending chunk_bypass_bytes) as follows:

for (b=4; b>=0; b−−)
BypassBitStream[BypassBitStreamLen++]=(chunk_bypass_5 bits>>b) & 1 chunk_bypass_num_flushed_bits specifies the number of bypass bits to be discarded from the end of the BypassBitStream:

BypassBitstreamLen−=chunk_bypass_num_flushed_bits

Example Encoding Process

Figure 5:
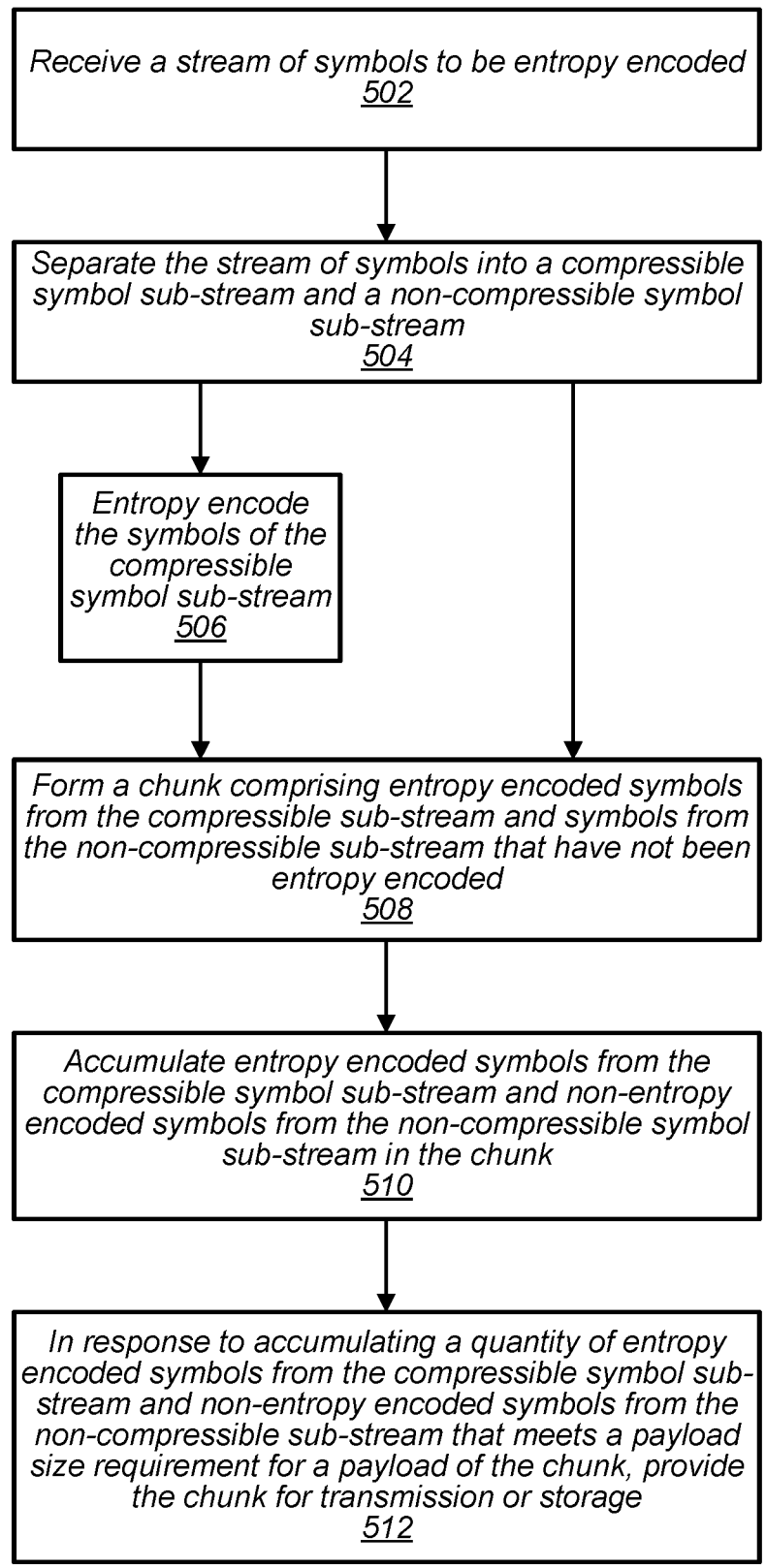
FIG. 5 illustrates an example process for encoding a stream of symbols comprising compressible and non-compressible symbols, according to some embodiments.

FIG. 5 illustrates an example process for encoding a stream of symbols comprising compressible and non-compressible symbols, according to some embodiments. At block 502, an encoder receives a stream of symbols to entropy encoded. The encoder may be implemented in hardware or may be implemented via program instructions that execute one or more processors of a computing device. At block 504, a parser of the encoder separates the stream of symbols into a first sub-stream comprising compressible symbols and a second sub-stream comprising non-compressible symbols. At block 506 the symbols of the compressible symbol sub-stream are entropy encoded. Note that the non-compressible symbol sub-stream bypasses the entropy encoding step of block 506. At block 508, the entropy encoded symbols that were encoded at 506 and the non-compressible symbols that were separated out into the second sub-stream of non-compressible symbols at block 504 are then combined in a chunk of a payload of a packet. At block 510 additional entropy encoded symbols and additional non-compressible symbols that have not been entropy encoded are accumulated in the chunk formed at 508. For example, the entropy encoded symbols may be added to the chunk from a front portion of the chunk in a direction towards a back portion of the chunk and the non-compressible symbols may be added to the chunk from a back portion of the chunk in a direction towards the front portion of the chunk, such as shown in FIG. 1B. At block 512, in response to the accumulated entropy encoded symbols and the non-compressible symbols accumulated in the chunk reaching a payload size for the chunk, such as 256 bytes, the chunk is provided for transmission, e.g. in a payload of a packet, or is provided for storage.

Example Decoding Process

Figure 6:
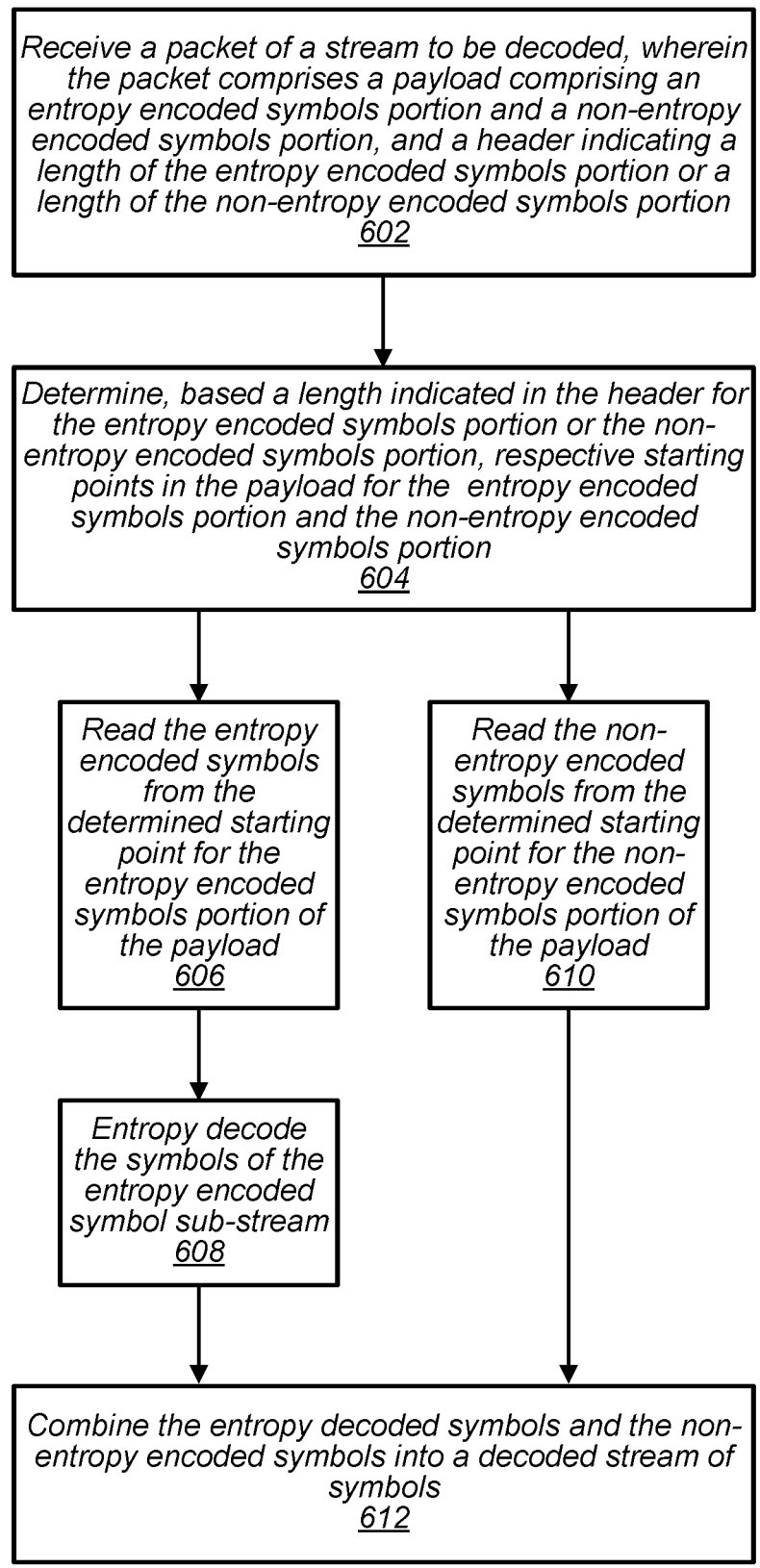
FIG. 6 illustrates an example process for decoding a payload of a packet comprising an entropy encoded symbols portion and a non-entropy encoded symbols portion, according to some embodiments.

FIG. 6 illustrates an example process for decoding a payload of a packet comprising an entropy encoded symbols portion and a non-entropy encoded symbols portion, according to some embodiments. At block 602, a decoder receives a packet of a stream that is to be decoded. The decoder may be implemented in hardware or may be implemented vie program instructions that are executed by one or more processors. The packet includes a payload comprising an entropy encoded symbols portion and a non-entropy encoded symbols portion. The packet also includes a header indicating a length of the entropy encoded symbols portion or a length of the non-entropy encoded symbols portion. At block 604, the decoder determines respective staring points for the entropy encoded symbols portion and the non-entropy encoded symbols portion based on the length indicated in the header. For example, if the payload has a known chunk size and either the length of the entropy encoded symbols portion or the length of the non-entropy encoded symbols portion is known (e.g. via the information included in the header) a starting point for one of the portions will be either a start or end of the chunk and a starting point for the other one of the portions can be determined based on subtracting the known portion length from the known chunk size of the payload.

At block 606, the decoder reads the entropy encoded symbols from the determined starting point of the entropy encoded symbols portion. At block 608, the decoder entropy decodes the entropy encoded symbols read from the entropy encoded symbols portion at block 606.

At block 610, the non-entropy encoded symbols are read from the determined starting point of the non-entropy encoded symbols portion of the payload. Note that the non-entropy encoded symbols bypass the entropy decoding step at block 608.

At block 612, the entropy decoded symbols and the non-entropy encoded symbols are combined into a decoded stream of symbols provided as an output of the decoder.

Example Computer System

Figure 7:
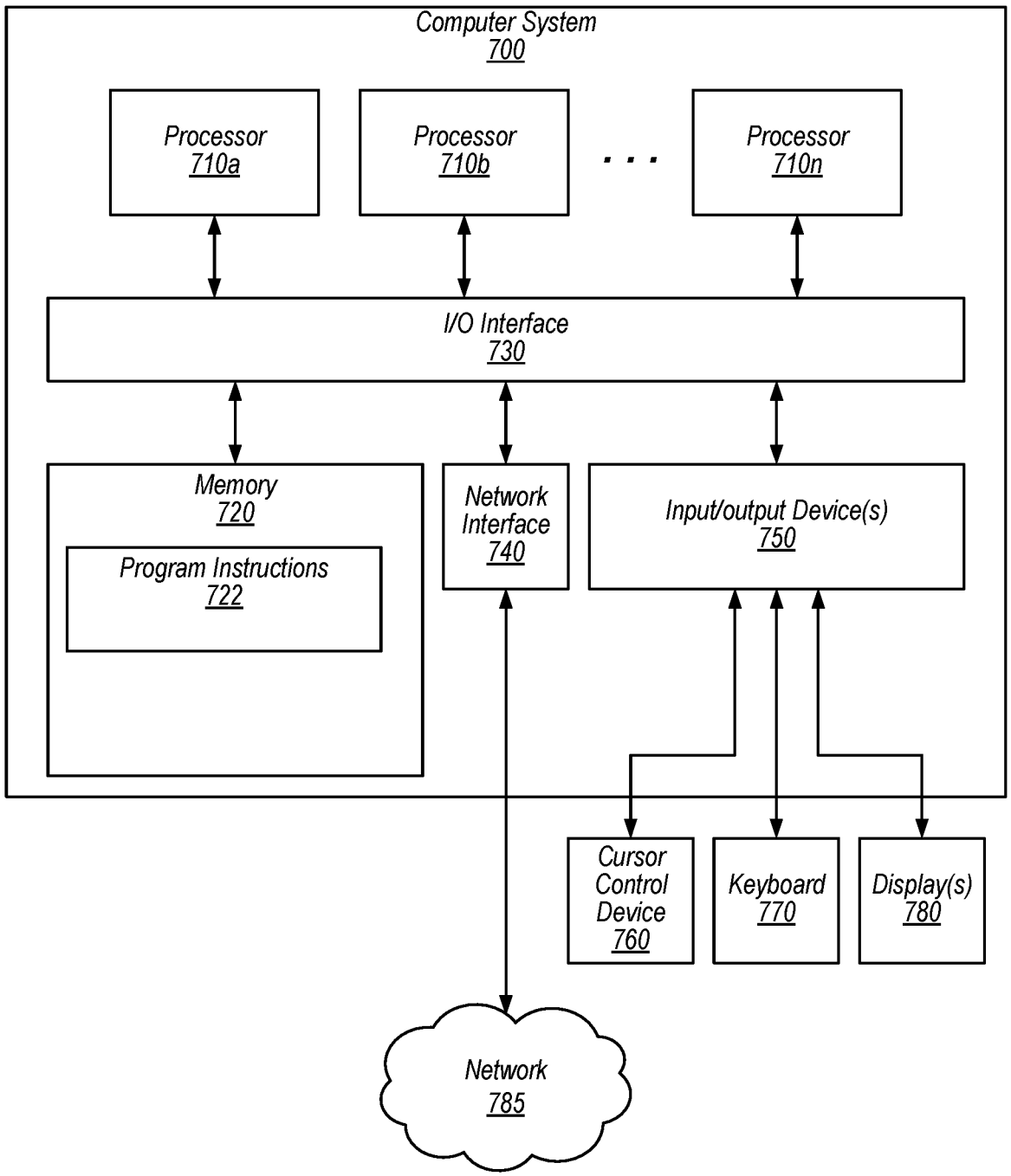
FIG. 7 illustrates an example computer system that may implement an encoder or decoder, according to some embodiments.

FIG. 7 illustrates an example computer system 700 that may implement an encoder or decoder or any other ones of the components described herein, (e.g., any of the components described above with reference to FIGS. 1-6), in accordance with some embodiments. The computer system 700 may be configured to execute any or all of the embodiments described above. In different embodiments, computer system 700 may be any of various types of devices, including, but not limited to, a personal computer system, desktop computer, laptop, notebook, tablet, slate, pad, or netbook computer, mainframe computer system, handheld computer, workstation, network computer, a camera, a set top box, a mobile device, a consumer device, video game console, handheld video game device, application server, storage device, a television, a video recording device, a peripheral device such as a switch, modem, router, or in general any type of computing or electronic device.

Various embodiments of an encoder or decoder, as described herein may be executed in one or more computer systems 700, which may interact with various other devices. Note that any component, action, or functionality described above with respect to FIGS. 1-6 may be implemented on one or more computers configured as computer system 700 of FIG. 7, according to various embodiments. In the illustrated embodiment, computer system 700 includes one or more processors 710 coupled to a system memory 720 via an input/output (I/O) interface 730. Computer system 700 further includes a network interface 740 coupled to I/O interface 730, and one or more input/output devices 750, such as cursor control device 760, keyboard 770, and display(s) 780. In some cases, it is contemplated that embodiments may be implemented using a single instance of computer system 700, while in other embodiments multiple such systems, or multiple nodes making up computer system 700, may be configured to host different portions or instances of embodiments. For example, in one embodiment some elements may be implemented via one or more nodes of computer system 700 that are distinct from those nodes implementing other elements.

In various embodiments, computer system 700 may be a uniprocessor system including one processor 710, or a multiprocessor system including several processors 710 (e.g., two, four, eight, or another suitable number). Processors 710 may be any suitable processor capable of executing instructions. For example, in various embodiments processors 710 may be general-purpose or embedded processors implementing any of a variety of instruction set architectures (ISAs), such as the x86, PowerPC, SPARC, or MIPS ISAs, or any other suitable ISA. In multiprocessor systems, each of processors 710 may commonly, but not necessarily, implement the same ISA.

System memory 720 may be configured to store point cloud compression or point cloud decompression program instructions 722 and/or sensor data accessible by processor 710. In various embodiments, system memory 720 may be implemented using any suitable memory technology, such as static random access memory (SRAM), synchronous dynamic RAM (SDRAM), nonvolatile/Flash-type memory, or any other type of memory. In the illustrated embodiment, program instructions 722 may be configured to implement an image sensor control application incorporating any of the functionality described above. In some embodiments, program instructions and/or data may be received, sent or stored upon different types of computer-accessible media or on similar media separate from system memory 720 or computer system 700. While computer system 700 is described as implementing the functionality of functional blocks of previous Figures, any of the functionality described herein may be implemented via such a computer system.

In one embodiment, I/O interface 730 may be configured to coordinate I/O traffic between processor 710, system memory 720, and any peripheral devices in the device, including network interface 740 or other peripheral interfaces, such as input/output devices 750. In some embodiments, I/O interface 730 may perform any necessary protocol, timing or other data transformations to convert data signals from one component (e.g., system memory 720) into a format suitable for use by another component (e.g., processor 710). In some embodiments, I/O interface 730 may include support for devices attached through various types of peripheral buses, such as a variant of the Peripheral Component Interconnect (PCI) bus standard or the Universal Serial Bus (USB) standard, for example. In some embodiments, the function of I/O interface 730 may be split into two or more separate components, such as a north bridge and a south bridge, for example. Also, in some embodiments some or all of the functionality of I/O interface 730, such as an interface to system memory 720, may be incorporated directly into processor 710.

Network interface 740 may be configured to allow data to be exchanged between computer system 700 and other devices attached to a network 785 (e.g., carrier or agent devices) or between nodes of computer system 700. Network 785 may in various embodiments include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, network interface 740 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 750 may, in some embodiments, include one or more display terminals, keyboards, keypads, touchpads, scanning devices, voice or optical recognition devices, or any other devices suitable for entering or accessing data by one or more computer systems 700. Multiple input/output devices 750 may be present in computer system 700 or may be distributed on various nodes of computer system 700. In some embodiments, similar input/output devices may be separate from computer system 700 and may interact with one or more nodes of computer system 700 through a wired or wireless connection, such as over network interface 740.

As shown in FIG. 7, memory 720 may include program instructions 722, which may be processor-executable to implement any element or action described above. In one embodiment, the program instructions may implement the methods described above. In other embodiments, different elements and data may be included. Note that data may include any data or information described above.

Those skilled in the art will appreciate that computer system 700 is merely illustrative and is not intended to limit the scope of embodiments. In particular, the computer system and devices may include any combination of hardware or software that can perform the indicated functions, including computers, network devices, Internet appliances, PDAs, wireless phones, pagers, etc. Computer system 700 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 700 may be transmitted to computer system 700 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Generally speaking, a computer-accessible medium may include a non-transitory, computer-readable storage medium or memory medium such as magnetic or optical media, e.g., disk or DVD/CD-ROM, volatile or non-volatile media such as RAM (e.g. SDRAM, DDR, RDRAM, SRAM, etc.), ROM, etc. In some embodiments, a computer-accessible medium may include transmission media or signals such as electrical, electromagnetic, or digital signals, conveyed via a communication medium such as network and/or a wireless link The methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the example configurations may be implemented as a combined structure or component. These and other variations, modifications, additions, and improvements may fall within the scope of embodiments as defined in the claims that follow.

What is claimed is:

1. A non-transitory computer-readable medium storing program instructions that, when executed by one or more processors, cause the one or more processors to:
   separate a stream of symbols to be entropy encoded into:
      (a) a compressible symbol sub-stream and (b) a non-compressible symbol bypass sub-stream;
   entropy encode the symbols of the compressible symbol sub-stream; and
   form a chunk comprising entropy encoded symbols from the compressible symbol sub-stream and non-compressible symbols from the non-compressible symbol bypass sub-stream;
   populate a syntax element for the chunk indicating:
      a length of the chunk that is filled with the entropy encoded symbols from the compressible sub-stream; or
      a length of the chunk that is filled with the non-compressible symbols from the non-compressible sub-stream; and
   provide the chunk for transmission or storage, in response to accumulating a quantity of entropy encoded symbols and non-compressible symbols meeting a payload size of a payload of the chunk.

2. The non-transitory computer-readable medium of claim 1, wherein the payload size of the chunk is less than a length of the stream of symbols to be encoded, and wherein the program instructions cause the one or more processors to:
   provide the chunk for transmission or storage prior to processing a full length of the stream of symbols to be entropy encoded.

3. The non-transitory computer-readable medium of claim 1,
   wherein the payload has a defined total length known or signaled to a decoder.

4. The non-transitory computer-readable medium of claim 1, wherein the syntax element is included in a header for the chunk, and wherein the header is further populated with an indicator as to whether or not entropy encoding probabilities are to be re-set prior to entropy decoding entropy encoded symbols of the chunk.

5. The non-transitory computer-readable medium of claim 1, wherein to form the chunk, the program instructions cause the one or more processors to:
   write a first one of the sub-streams to a first end of a packet in a forward order; and
   write a second one of the sub-streams to a second end of the packet in a reserve order.

6. The non-transitory computer-readable medium of claim 1, wherein to form the chunk, the program instructions cause the one or more processors to:
   write the entropy encoded symbols of the compressible symbols sub-stream to a compressible symbol sub-stream buffer;
   write the non-compressible symbols of the bypass sub-stream to a bypass sub-stream buffer; and
   concatenate the compressible sub-stream buffer with the bypass sub-stream buffer to form the payload of the chunk, in response to a sum of the entropy encoded symbols written to the compressible symbol sub-stream buffer and the non-compressible symbols written to the bypass symbols sub-stream buffer accumulating to meet the payload size of the chunk.

7. The non-transitory computer-readable medium of claim 1, wherein to form the chunk, the program instructions cause the one or more processors to:
   reserve a byte of the payload of the chunk for writing non-compressible symbol bits; and
   refrain from providing the chunk for transmission until at least the reserved byte is filled with non-compressible symbols bits.

8. The non-transitory computer-readable medium of claim 1, wherein the program instructions cause the one or more processors to:
   identify one or more entropy encoded bytes that have a decoding dependency on one or more non-compressible symbols in the bypass sub-stream;
   estimate a number of chunks being buffered at a decoder to enable the decoder to decode the one or more entropy encoded bytes using the one or more non-compressible symbols, wherein the one or more non-compressible symbols are included in separate chunks from the one or more entropy encoded bytes with the decoding dependency on the one or more non-compressible symbol; and
   in response to determining the estimated number of chunks being buffered at the decoder is less than a threshold number of buffered chunks, continue to provide chunks for transmission or storage that include entropy encoded bytes that have a coding dependency on one or more non-compressible symbols that have yet to be included in a provided chunk; or
   in response to determining the estimated number of chunks being buffered at the decoder is equal to or greater than the threshold number of chunks, refraining from providing chunks for transmission or storage that include entropy encoded bytes that have a coding dependency on one or more non-compressible symbols that yet to be included in a provided chunk.

9. The non-transitory computer-readable medium of claim 1, wherein the syntax element is included in a header for the chunk, and wherein to form the chunk, the program instructions cause the one or more processors to:
   reserve a byte of the payload of the chunk for writing non-compressible symbol bits; and
   indicate in the header for the chunk:
      valid bits of the reserved byte that are filled with non-compressible symbols bits, if all bits of the reserved byte are not filled with non-compressible symbol bits.

10. A non-transitory computer-readable medium storing program instructions that, when executed by the one or more processors, cause the one or more processors to:
   receive a packet comprising:
      a payload comprising an entropy encoded symbols portion and a non-entropy encoded symbols portion; and
      a header indicating:
         a length of the payload that is filled with entropy encoded symbols; or
         a length of the payload that is filled with non-entropy encoded symbols;
   determine based on the header, a starting point in the payload for the entropy encoded symbols and a starting point in the payload for the non-entropy encoded symbols;

read the entropy encoded symbols from the determined starting point for the entropy encoded symbols and decode the read entropy encoded symbols;

read the non-entropy encoded symbols from the determined starting point for the non-entropy encoded symbols; and combine the decoded entropy encoded symbols and the non-entropy encoded symbols into a decoded stream of symbols.

11. The non-transitory computer-readable medium of claim 10, wherein the header further comprises:

data indicating invalid bits of non-entropy encoded bytes included in the payload.

12. The non-transitory computer-readable medium of claim 10, wherein the header further comprises an indicator indicating entropy encoding probabilities are to be re-set prior to entropy decoding entropy encoded symbols of the packet, wherein the program instructions cause the one or more processors to:

reset probabilities used for the entropy decoding of the entropy encoded symbols.

13. The non-transitory computer-readable medium of claim 10, wherein a sequence header for a sequence of frames, compressed into a set of packets comprising the packet and one or more additional packets, comprises an indicator indicating entropy encoding probabilities are to be re-set prior to entropy decoding entropy encoded symbols of the sequence of frames, wherein the program instructions cause the one or more processors to:

reset probabilities used for the entropy decoding of the entropy encoded symbols of the packet and the one or more additional packets of the set.

14. The non-transitory computer-readable medium of claim 10, wherein a frame header for a frame, compressed into a set of one or more packets comprising the packet, comprises an indicator indicating entropy encoding probabilities are to be re-set prior to entropy decoding entropy encoded symbols of the frame, and wherein the program instructions cause the one or more processors to:

reset probabilities used for the entropy decoding of the entropy encoded symbols of the set of one or more packets.

15. The non-transitory computer-readable medium of claim 10, wherein a frame header for a frame or a sequence header for a sequence of frames comprises an indicator indicating entropy encoding probabilities are to be re-set prior to entropy decoding entropy encoded symbols of the frame or prior to decoding entropy encoded symbols of the sequence of frames, and wherein the packet is included in the sequence of frames or the frame, and wherein the header of the packet comprises an indicator indicating entropy encoding probabilities are to be re-set prior to entropy decoding entropy encoded symbols of the packet wherein the program instructions cause the one or more processors to:

reset probabilities prior to decoding the sequence of frames or the frame; and additional reset probabilities prior to decoding the packet included in the sequence of frames or included in the frame.

16. A system, comprising:

one or more memories storing program instructions; and one or more processors, wherein the program instructions, when executed on the one or more processors, cause the one or more processors to:

separate a stream of symbols to be entropy encoded into: (a) a compressible symbol sub-stream and (b) a non-compressible symbol sub-stream;

entropy encode the symbols of the compressible symbol sub-stream; and form a packet comprising entropy encoded symbols from the compressible symbol sub-stream and non-compressible symbols from the bypass sub-stream;

populate a syntax element for the chunk indicating:

a length of the chunk that is filled with the entropy encoded symbols from the compressible sub-stream; or a length of the chunk that is filled with the non-compressible symbols from the non-compressible sub-stream; and provide the packet for transmission or storage, in response to accumulating a quantity of entropy encoded symbols and non-compressible symbols meeting a payload size of a payload of the packet.

17. The system of claim 16, wherein the program instructions, when executed by the one or more processors, cause the one or more processors to:

reserve a byte of the payload of the packet for writing non-compressible symbol bits; and refrain from providing the packet for transmission until at least the reserved byte is filled with non-compressible symbols bits.

18. The system of claim 17, wherein the program instructions, when executed by the one or more processors, cause the one or more processors to:

in response to refraining from providing the packet for transmission or storage for more than a threshold amount of time:

provide the packet for transmission or storage with at least some bits of the reserved byte not filled with non-compressible symbols bits.

19. The system of claim 18, wherein the program instructions, when executed by the one or more processors, cause the one or more processors to:

include, in a header of the packet, data indicating valid bits of the reserved byte that are filled with non-compressible symbols bits.

20. The system of claim 16, wherein to form the chunk, the program instructions cause the one or more processors to:

write a first one of sub-streams to a first end of a packet in a forward order; and write a second one of the sub-streams to a second end of the packet in a reserve order.

* * * * *